(12) United States Patent
Wang et al.

(10) Patent No.: US 6,465,267 B1
(45) Date of Patent: Oct. 15, 2002

(54) METHOD OF MEASURING GATE CAPACITANCE TO DETERMINE THE ELECTRICAL THICKNESS OF GATE DIELECTRICS

(75) Inventors: Haihong Wang; Qi Xiang, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 22 days.

(21) Appl. No.: 09/824,408

(22) Filed: Apr. 2, 2001

(51) Int. Cl.[7] .............................. H01L 21/66
(52) U.S. Cl. ............... 438/17; 438/14; 438/18
(58) Field of Search ................ 324/769, 766, 324/765; 438/257, 259, 235, 302, 307, 585, 529, 17, 14, 18; 257/48

(56) References Cited

U.S. PATENT DOCUMENTS

| | | | | |
|---|---|---|---|---|
| 4,484,076 A | * | 11/1984 | Thomson | 250/370 |
| 4,860,064 A | * | 8/1989 | Luryi | 257/14 |
| 5,367,186 A | * | 11/1994 | Vinal et al. | 257/327 |
| 5,374,836 A | * | 12/1994 | Vinal et al. | 257/344 |
| 5,736,454 A | * | 4/1998 | Hwu et al. | 438/585 |
| 5,891,783 A | * | 4/1999 | Lin et al. | 438/302 |
| 5,986,045 A | * | 11/1999 | Lau et al. | 528/401 |
| 6,368,915 B1 | * | 3/2000 | Montree et al. | 438/257 |
| 6,303,520 B1 | * | 10/2001 | Kwong et al. | 438/769 |

* cited by examiner

Primary Examiner—N. Le
Assistant Examiner—Wasseem H. Hamdan
(74) Attorney, Agent, or Firm—Foley & Lardner

(57) ABSTRACT

The disclosure describes an exemplary method of measuring gate capacitance to determine electrical thickness of a gate dielectric located in a gate structure of a metal oxide semiconductor field effect transistor (MOSFET). This method can include connecting a meter to an integrated circuit gate structure and an active region located proximate the integrated circuit gate structure, applying forward body bias to the transistor to reduce the electrical field of the transistor at a gate inversion measuring point; and measuring capacitance from the meter while the transistor receives the forward body bias.

15 Claims, 2 Drawing Sheets

METHOD OF MEASURING GATE CAPACITANCE TO DETERMINE THE ELECTRICAL THICKNESS OF GATE DIELECTRICS

FIELD OF THE INVENTION

The present specification relates generally to integrated circuits and methods of fabricating integrated circuits. More specifically, the present specification relates to a method of measuring gate capacitance in an integrated circuit to determine the electrical thickness of metal oxide semiconductor (MOS) gate dielectrics.

BACKGROUND OF THE INVENTION

Integrated circuits (ICs) include a multiple of transistors formed on a semiconductor substrate. Transistors, such as, metal oxide semiconductor field effect transistors (MOSFETs), are generally built on the top surface of a bulk substrate. The substrate is built to form impurity diffusion layers (i.e., source and drain regions). Between the source and drain regions is a conductive layer which operates as a gate for the transistor. The gate controls current in a channel between the source and drain regions.

Typically, an integrated circuit gate includes a gate electrode and a gate dielectric. The electrical thickness of MOS gate dielectrics can be an important parameter in the design and fabrication of the circuit. Such a thickness determination can be made from the gate capacitance in the inversion region. The inversion region refers to the characteristic of a transistor where the channel between active regions and under the gate is "inverted". That is, the channel changes from a semiconductor P-type to N-type or N-type to P-type. Generally, the inversion region occurs when the gate to source voltage ($V_{gs}$) is greater than or equal to the threshold voltage ($V_{th}$).

However, as the physical thickness of gate dielectrics decreases (with the continuing decrease in integrated circuit size), gate leakage current due to direct tunneling increases. As a result, inversion region capacitance-voltage (C-V) characteristics can be so distorted (from gate leakage current) that the electrical thickness extraction or determination is less accurate.

Accordingly, there is a need for an improved technique for gate capacitance-voltage (C-V) measurement. Further, there is a need to use forwarded biased MOSFET structures to measure the inversion region gate capacitance at a reduced gate electrical field, thereby reducing the effects of gate leakage. Even further, there is a need for a method of measuring gate capacitance to more accurately determine the thickness of gate dielectrics.

SUMMARY OF THE INVENTION

An exemplary embodiment relates to a method of measuring gate capacitance to determine electrical thickness of a gate dielectric located in a gate structure of a metal oxide semiconductor field effect transistor (MOSFET). This method can include connecting a sensor to an integrated circuit gate structure and an active region located proximate the integrated circuit gate structure, applying forward body bias to the transistor to reduce the electrical field of the transistor at a gate inversion measuring point, and measuring capacitance with the sensor while the transistor receives the forward body bias.

Another exemplary embodiment relates to a method of measuring gate dielectric thickness in a metal oxide semiconductor field effect transistor (MOSFET). This method can include applying a voltage to a back gate of a transistor to reduce threshold voltage of the transistor, connecting a capacitance-voltage meter to the transistor, using the capacitance-voltage meter to measure the capacitance at a voltage above the threshold voltage of the transistor, and automatically determining thickness of a gate dielectric in the transistor using the measured capacitance.

Another exemplary embodiment relates to a method of automatically determining gate capacitance in a transistor having a gate structure including a gate dielectric. This method can include forward biasing a transistor having a gate structure and a size greater than 100 square microns to reduce a voltage threshold of the transistor and measuring capacitance of the transistor at a voltage above the voltage threshold of the transistor.

Other features and advantages of the exemplary embodiments will become apparent to those skilled in the art upon review of the following drawings, the detailed description, and the appended claims.

BRIEF DESCRIPTION OF THE DRAWINGS

The invention is illustrated by way of example and not limitation by the figures of the accompanying drawings, in which like references indicates similar elements and in which.

DETAILED DESCRIPTION OF EXEMPLARY EMBODIMENTS

Figure 1:
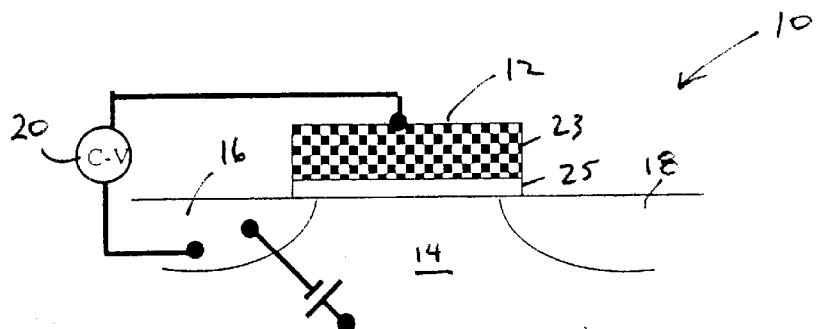
FIG. 1 is a schematic representation of a gate capacitance measurement configuration in accordance with an exemplary embodiment.

Referring to FIG. 1, a schematic 10 includes a gate 12, a substrate 14, a source 16, a drain 18, and a meter 20. Gate 12, substrate 14, source 16, and drain 18 are part of an integrated circuit (IC) device including several transistors, such as, metal oxide semiconductor field effect transistors (MOSFETs). In an exemplary embodiment, a large MOSFET, (e.g., greater than 100 microns$^2$) is used to measure gate capacitance.

Gate 12 can include a gate electrode 23 and a gate dielectric 25. Gate 12 is aligned between source 16 and drain 18. Source 16 and drain 18 are active regions in substrate 14 impurities or dopants, such as, a P-type dopant (e.g., boron) or an N-type dopant (e.g., phosphorous).

Meter 20 is a sensor configured to measure capacitance and voltage. An example of meter 20 is a 4284A LCR meter manufactured by Agilent Technologies of Palo Alto, Calif. Alternatively, meter 20 can be part of a workstation or a computer. The computer executes software that determines capacitance in response to a voltage measurement.

In an exemplary embodiment, meter 20 is coupled to gate 12 and source 16. Gate inversion capacitance can be obtained by connecting meter 20 to gate 12 and source 16 and taking a sweep gate voltage measurement. The sweep gate voltage can be from 0.0 to 1.0 volts. In order to determine device capacitance, and, consequently, the thickness of gate dielectric 25, gate inversion capacitance is measured at the strong inversion region. The onset of the strong inversion region is marked by the device threshold voltage ($V_{TH}$). The thickness of gate dielectric 25 can be determined using measured capacitance utilizing the formula $$t_{inv} = \frac{EoxEo}{C} A$$

where Eox is the relative value of the dielectric constant, Eo is the permativity of free space, C is the measured capacitance, and A is the size of the MOSFET.

In an exemplary embodiment, the device threshold voltage ($V_{TH}$) is lowered by forward biasing the transistor. Forward biasing the transistor can be at a voltage, such as, 0.5 V, which then lowers the gate voltage and, hence, the amount of gate leakage current experienced. The transistor can be biased at a voltage controlled by the contact potential of a p-n junction in the transistor. This contact potential and bias voltage are related by the formula $$Vo = \frac{kt}{q} \ln \frac{NaNd}{n_i^2},$$

where k is the Boltzman constant, t is the temperature, q is the charge, Na is the acceptor density, Nd is the donor density, and $n_1$ is the intrinsic carrier density. Advantageously, with lass gate leakage current present, more accurate capacitance measurements can be obtained as well as more accurate measurements of the gate dielectric.

Advantageously, this technique of measuring capacitance and, thereby, determining gate dielectric thickness is compatible with capacitance voltage measurement tools available. Further, this technique can be employed automatically by measuring devices and measuring equipment. Such a measurement can be made in a wafer fabrication process included on an in-line measurement system in an integrated circuit fabrication process.

Figure 2:
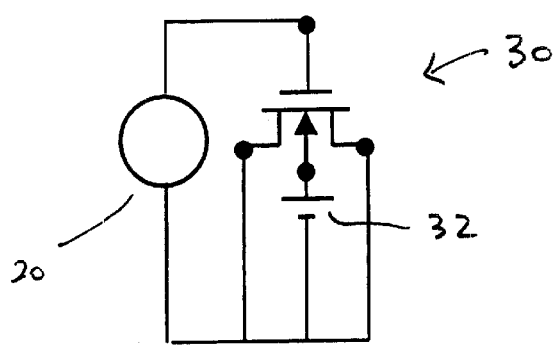
FIG. 2 is a circuit diagram representation of the gate capacitance measurement configuration of FIG. 1.

FIG. 2 illustrates a circuit diagram representation where meter 20 is coupled to MOSFET 30. MOSFET 32 includes a back gate 32 which, in an exemplary embodiment, is forward biased. Forward bias to back gate 32 reduces threshold voltage (VTH). As explained above, reduction of the threshold voltage reduces the gate electrical field and gate leakage current. Reduction of the threshold voltage also reduces the onset of the strong inversion region, where capacitance is measured. Thus, forward biasing the transistor before a capacitance measurement is taken advantageously reduces the measuring point such that less leakage current is experience, resulting in less distortion in the capacitance-voltage measurement. For example, gate leakage can be reduced from 0.1 A/cm$^2$ to 0.01 A/cm$^2$.

Figure 3:
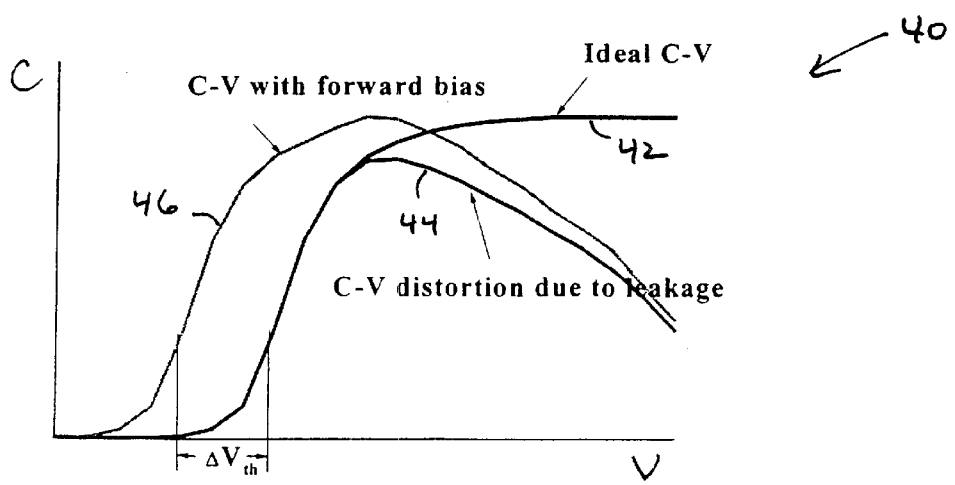
FIG. 3 is a plot of capacitance and voltage under various conditions.

FIG. 3 illustrates a graph 40 of capacitance and voltage. Line 42 represents the ideal capacitance-voltage relationship. Line 44 represents capacitance-voltage distortion due to gate leakage. Line 46 represents capacitance-voltage with forward bias applied.

Advantageously, the technique of capacitance measurement described with reference to FIGS. 1–3, provides for a closer approximation of the ideal C-V in the strong inversion region above the threshold region. Line 46 illustrates that less distortion occurs in the C-V measurement due to leakage when forward bias is used than when not used (line 44). This technique can be automatically followed by measuring instruments to provide a more accurate capacitance determination.

Figure 4:
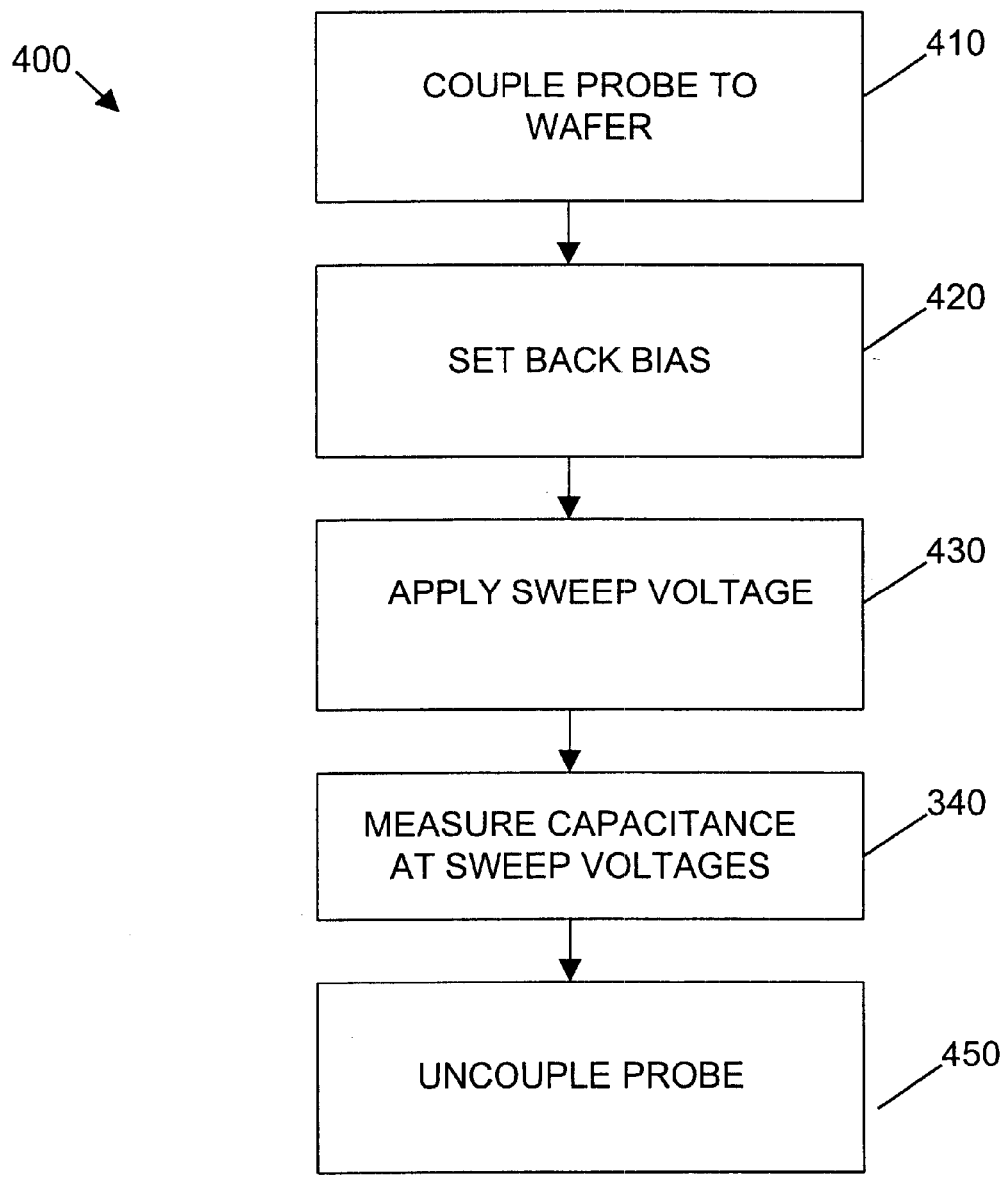
FIG. 4 is a flow diagram depicting an exemplary measurement process in accordance with an exemplary embodiment.

FIG. 4 illustrates a flow diagram 400 showing steps in an exemplary measurement process. In a step 410, a sensor probe is coupled to an integrated circuit wafer. In an exemplary embodiment, a sensor probe is coupled to the integrated circuit wafer from a computer workstation in an in-line wafer manufacturing system. In another exemplary embodiment, the sensor probe is coupled to the wafer manually.

After step 410, a step 420 is performed in which the back bias is set. In an exemplary embodiment, a back bias of 0.5 volts is applied. After step 420 is performed, a step 430 is performed in which a sweep voltage is applied. In an exemplary embodiment, sweep voltage can include a range of voltages between 0.0 volts and 1.0 volts. In a step 440, capacitance is measured at the sweep voltages. In an exemplary embodiment, capacitance is determined automatically using a computer to determine capacitance from measured voltage. After step 440, a step 450 is performed in which the sensor probe is uncoupled.

While the embodiments illustrated in the FIGURES and described above are presently preferred, it should be understood that these embodiments are offered by way of example only. Other embodiments may include a variety of different processes for carrying out the functions described. The invention is not limited to a particular embodiment, but extends to various modifications, combinations, and permutations that nevertheless fall within the scope and spirit of the appended claims.

What is claimed is:

1. A method of measuring gate capacitance to determine electrical thickness of a gate dielectric located in a gate structure of a metal oxide semiconductor field effect transistor (MOSFET), the method comprising:

connecting a sensor to an integrated circuit gate structure and an active region located proximate the integrated circuit gate structure, the integrated circuit gate structure and active region being part of a transistor, wherein the transistor is a metal oxide semiconductor field effect transistor (MOSFET) having a size greater than 100 square microns;

applying forward body bias to the transistor by applying a sweeping gate voltage ranging from 0.0 to 1.0 volts whereby the electrical field of the transistor is reduced at a gate inversion measuring point; and measuring capacitance from the sensor while the transistor receives the forward body bias.

2. The method of claim 1, wherein the step of applying forward body bias comprises applying a 0.5 Volt bias to reduce the electrical field at a gate inversion measuring point.

3. The apparatus of claim 1, further comprising determining electrical thickness of the gate dielectric from the measured capacitance.

4. A method of measuring gate dielectric thickness in a metal oxide semiconductor field effect transistor (MOSFET), the method comprising:

applying a voltage to a back gate of a transistor to reduce threshold voltage of the transistor;

connecting a capacitance-voltage meter to the transistor;

using the capacitance-voltage meter to measure the capacitance at a voltage above the threshold voltage of the transistor; and automatically determining thickness of a gate dielectric in the transistor using the measured capacitance by utilizing the formula $$t_{inv} = \frac{E_{ox}E_o}{C} A.$$

5. The method of claim 4, wherein the step of applying a voltage to a back gate of a transistor to reduce threshold voltage of the transistor comprises applying a voltage of 0.5 volts.

6. The method of claim 4, wherein the transistor is a metal oxide semiconductor field effect transistor (MOSFET) having a size greater than 100 square microns.

7. The method of claim 4, wherein gate leakage of the transistor is reduced from 0.1 A/cm$^2$ to 0.01 A/cm$^2$.

8. The method of claim 4, further comprising providing a voltage sweep.

9. The method of claim 4, wherein the step of using the capacitance-voltage meter to measure the capacitance at a voltage above the threshold voltage of the transistor comprises connecting the capacitance-voltage meter to a gate and a source region of the transistor.

10. A method of automatically determining gate capacitance in a transistor having a gate structure including a gate dielectric, the a method comprising:

forward biasing a transistor at a voltage which is controlled by the contact potential of a p-n junction in the transistor where the contact potential and bias voltage are rotated by the formula $$V_O = \frac{kt}{q} \ln \frac{N_a N_d}{n_i^2}$$

the transistor having a gate structure, the transistor further having a size greater than 100 square microns, whereby voltage threshold of the transistor is reduced; and measuring capacitance of the transistor at a voltage above the voltage threshold of the transistor.

11. The method of claim 10, wherein the step of forward biasing a transistor includes reducing gate leakage.

12. The method of claim 10, wherein the step of forward biasing a transistor comprises providing a 0.5 volt voltage to a back gate of the transistor.

13. The method of claim 10, further comprising providing a voltage sweep.

14. The method of claim 10, wherein the step of forward biasing a transistor comprises biasing the transistor at a voltage which is controlled by the contact potential of a p-n junction in the transistor.

15. The method of claim 10, wherein the transistor has a size greater than 100 square microns.

* * * * *